United States Patent
Tanzi et al.

(10) Patent No.: US 9,602,149 B1
(45) Date of Patent: Mar. 21, 2017

(54) ARCHITECTURE AND CONTROL OF HYBRID COUPLER BASED ANALOG SELF-INTERFERENCE CANCELLATION

(71) Applicant: Intel IP Corporation, Santa Clara, CA (US)

(72) Inventors: Nebil Tanzi, Hoffman Estates, IL (US); Gregory Chance, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/976,647

(22) Filed: Dec. 21, 2015

(51) Int. Cl.
*H04B 1/38* (2015.01)
*H04B 1/04* (2006.01)
*H04B 17/318* (2015.01)
*H04B 1/12* (2006.01)

(52) U.S. Cl.
CPC ........... *H04B 1/0475* (2013.01); *H04B 1/123* (2013.01); *H04B 17/318* (2015.01)

(58) Field of Classification Search
CPC ...... H04B 1/525; H04B 7/0413; H04B 15/00; H04B 1/123; H04B 1/48; H04B 1/56; H04B 1/38; H04B 1/44; H04L 5/14
USPC .......................... 375/219; 370/278, 252, 277
See application file for complete search history.

(56) References Cited

U.S. PATENT DOCUMENTS

| | | |
|---|---|---|
| 2014/0198688 A1 | 7/2014 | Li et al. |
| 2015/0171903 A1 | 6/2015 | Mehlman et al. |
| 2015/0215937 A1* | 7/2015 | Khandani ............. H04W 76/02 370/277 |

OTHER PUBLICATIONS

"Power Dividers and Directional Couplers." pp. 6-4.1-6-4.5. Dec. 16, 1998.
"AntennaPlus." Antenna Plus, 2015, 1 page. Published in 2015.
"White Paper: Interference in Cellular Networks." JDSU, 12 pages. Sep. 2013.
"Smartphone and Cellular Phone Antenna Design.", 4 pages. Published in 2015.
MACCM "RF Directional Couplers and 3dB Hybrids Overview." Published in 2015.
U.S. Appl. No. 14/751,579, filed Jun. 26, 2015.
Non Final Office Action Dated Dec. 20, 2016 U.S. Appl. No. 14/751,579.

* cited by examiner

*Primary Examiner* — Leila Malek
(74) *Attorney, Agent, or Firm* — Eschweiler & Potashnik, LLC

(57) ABSTRACT

An apparatus for interference cancellation in a wireless communication system, includes a cancellation unit configured to receive a transmit (Tx) signal from an output port of a power amplifier and a receive (Rx) signal from an antenna, and generate a cancellation of a primary portion of the Tx signal from the Rx signal at an output thereof, leaving a residual portion as a residual Tx signal, wherein the output of the cancellation unit is coupled to an Rx input port of a transceiver. The apparatus further includes a compensation control unit configured to modify one or more signals within the cancellation unit, based on the residual Tx signal at the output of the cancellation unit.

24 Claims, 6 Drawing Sheets

ARCHITECTURE AND CONTROL OF HYBRID COUPLER BASED ANALOG SELF-INTERFERENCE CANCELLATION

FIELD

The present disclosure relates to wireless communication systems and, in particular to an apparatus for interference cancellation in wireless communication systems.

BACKGROUND

Interference in cellular networks is a common problem in radio access networks. In frequency division duplex (FDD) cellular systems, both the receiver and transmitter are active at the same time. As a result, a transmit (Tx) signal from the transmitter leaks into the receiver causing interference in a receive (Rx) signal from an antenna. The interference can result in dropped calls, decreased receiver sensitivity (and range), an increased Rx noise figure and desensitization of receive-system active components.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
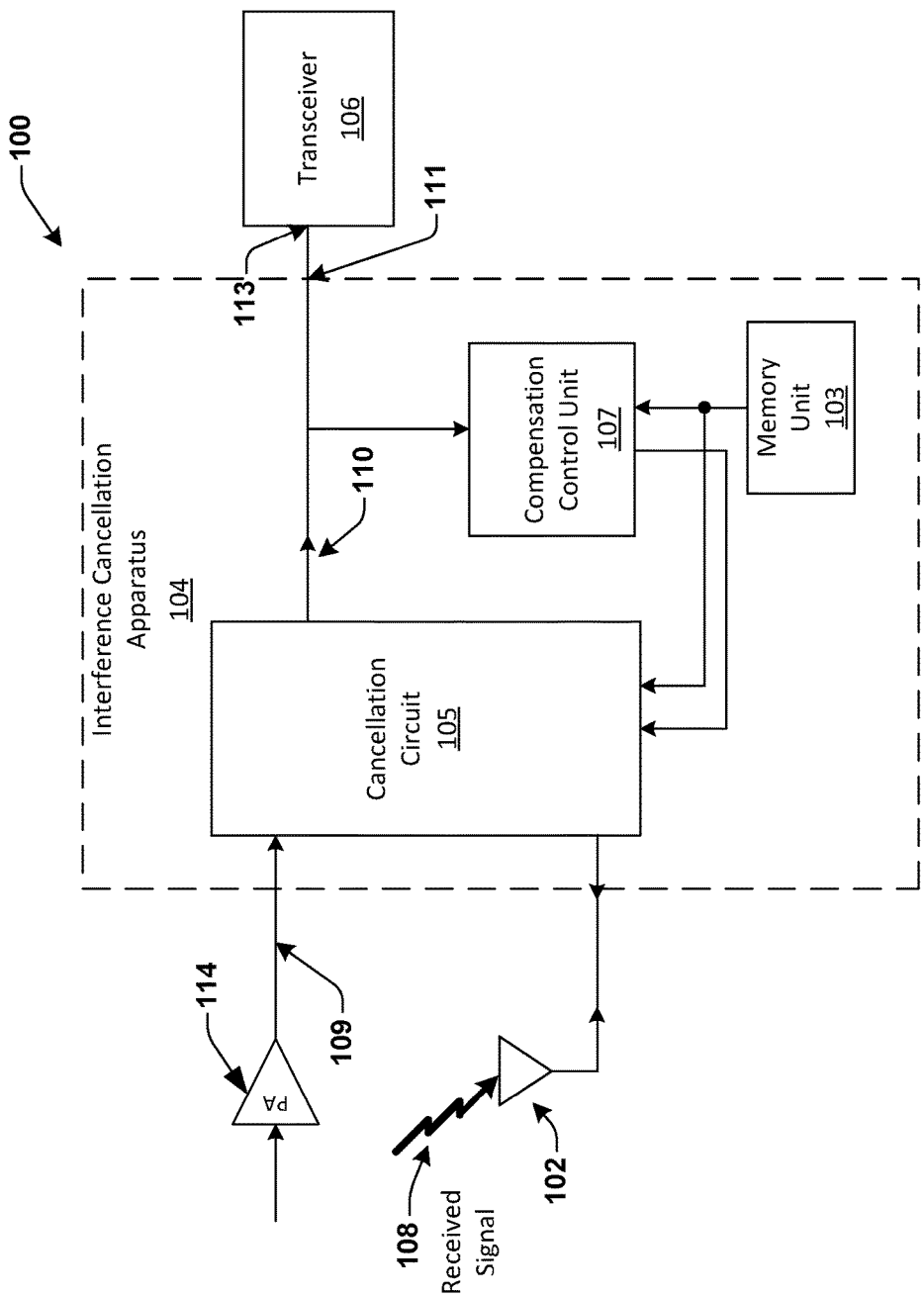
FIG. 1 shows a simplified block diagram of an example front-end system 100 of a cellular system comprising an interference cancellation apparatus, according to one embodiment of the disclosure.

In one embodiment of the disclosure, an apparatus for interference cancellation in a wireless communication system comprises a cancellation unit configured to receive a transmit (Tx) signal from an output port of a power amplifier and a receive (Rx) signal from an antenna, and generate a cancellation of a primary portion of the Tx signal from the Rx signal at an output thereof, leaving a residual portion as a residual Tx signal. The output of the cancellation unit is coupled to an Rx input port of a transceiver. Further, the apparatus comprises a compensation control unit configured to modify one or more signals within the cancellation unit, based on the residual Tx signal at the output of the cancellation unit.

In one embodiment of the disclosure, an apparatus for interference cancellation in a wireless communication system comprises a first coupling unit configured to receive a transmit (Tx) signal from an output port of a power amplifier and generate an in-phase Tx signal in a first signal path and a quadrature Tx signal in a second signal path. The first coupling unit is further configured to receive a receive (Rx) signal from an antenna and generate an in-phase Rx signal in the second signal path and a quadrature Rx signal in the first signal path. The apparatus further comprises a receive filter unit coupled to the first signal path and the second signal path and configured to generate an overall quadrature receive signal comprising the quadrature Rx signal and a residual component of the in-phase Tx signal in a third signal path, and generate an overall in-phase receive signal comprising the in-phase Rx signal and a residual component of the quadrature Tx signal in a fourth signal path. Furthermore, the apparatus comprises a second coupling unit configured to receive the overall quadrature receive signal along the third signal path and the overall in-phase receive signal along the fourth signal path, and generate an overall receive signal comprising a desired Rx signal and a residual Tx signal at an output thereof. In addition, the apparatus comprises a feedback receiver unit configured to selectively generate a compensation signal based on a measured power of the residual Tx signal or a signal associated therewith and a compensation unit configured to modify the overall in-phase receive signal or the overall quadrature receive signal or both, based on the compensation signal.

In one embodiment of the disclosure, a method for interference cancellation in a wireless communication system comprises receiving a transmit (Tx) signal and a receive (Rx) signal at a first coupling unit and generating a first signal comprising a quadrature Rx signal and an in-phase Tx signal in a first signal path and a second signal comprising an in-phase Rx signal and a quadrature Tx signal in a second signal path. The method further comprises filtering the first signal and the second signal at a receive filter unit to generate an overall quadrature receive signal comprising the quadrature Rx signal and a residual component of the in-phase Tx signal in a third signal path, and an overall in-phase receive signal comprising the in-phase Rx signal and a residual component of the quadrature Tx signal in a fourth signal path respectively. In addition, the method comprises receiving the overall quadrature receive signal along the third signal path and the overall in-phase receive signal along the fourth signal path at a second coupling unit, and generating an overall receive signal comprising a desired Rx signal and a residual Tx signal. The method further comprises selectively generating a compensation signal at the feedback receiver unit for compensating the overall quadrature signal along the third signal path or the overall in-phase signal along the fourth signal path or both, based on the residual Tx signal or a signal associated therewith.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "unit," "element," and the like are intended to refer to an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a unit can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. As used in this application, the term "sample" or "sampling" or "sampled" is intended to mean "isolating a signal" or "coupling a signal" rather than the conventional usage which means "reduction of a continuous signal to a discrete signal". The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, interference in cellular networks is one of the most common problems in the radio access network. The effects of interference range from being a minor annoyance to making the wireless system completely unusable. Different systems and services such as mobile communications, mobile radios, paging, wireless local area networks, and digital video broadcasting each use an assigned spectrum to avoid transmitting different services at the same frequency, causing signal collisions or interference. However, even if different wireless services do not generate harmonics, frequency drifts, or RF leakage, cell sites and user equipment (UE) are subject to internal interference caused by the improper conductivity of passive devices such as connectors, cables, or antennas.

This disclosure is directed towards an apparatus for self-interference cancellation in a wireless device and a method for implementing the self-interference cancellation. In frequency division duplex (FDD) cellular systems, both the receiver and transmitter are active at the same time. As a result, a transmit (Tx) signal from the transmitter leaks into the receiver causing interference in a receive (Rx) signal. In order to prevent the transmitter from leaking into the receiver, filters are used in the front end of the cellular systems. Typically, in conventional systems, expensive, high-performance filters implemented in surface acoustic wave (SAW) or bulk acoustic wave (BAW) technologies are used. These filters may prevent the Tx signals from leaking into the Rx signals, however, these high-performance filters at the front end incur significant cost for an original equipment manufacturer (OEM). Active components or devices such as amplifiers are also required in wireless systems, and active components are prone to generating noise. In addition, the active components consume battery power and have a negative impact on the overall battery life of the system. The filters can compensate for the noise generated by the active components, but they also add insertion loss which results in additional battery power consumption. To provide a low cost and more energy efficient alternative, it has been proposed that the expensive filters be replaced by lower cost and lower insertion loss filters and their performance augmented by using self-interference cancellation. One such topology utilizes quadrature hybrid couplers to cancel out the interference, for example, the Tx signal from the Rx signal. While these solutions may be interesting for enabling low-cost filters, they do not take into account the imperfections of the quadrature hybrid couplers which lead to limited cancellation of the Tx signal. Further, they do not address how to maintain the cancellation as the operating conditions changes (for example, with VSWR or temperature changes). A compensation mechanism for compensating the imperfections of the quadrature hybrid couplers and a calibration methodology to enable a closed loop control of the compensation parameters is thus required to overcome this issue. Therefore, an apparatus for compensating the imperfections of the quadrature hybrid couplers and dynamically determining the compensation parameters is introduced in the present disclosure. In some embodiments of the disclosure, the calibration methodology is realized using a feedback receiver that measures the Tx signal in the Rx signal path.

In the following description, examples will be described and explained in more detail with respect to the interference cancellation in the Rx signal path of front-end systems in cellular networks. In particular, in one embodiment of this disclosure, an apparatus for self-interference cancellation in the receive (Rx) signal path of a wireless communication system comprising quadrature hybrid couplers is described.

FIG. 1 depicts an example front-end system 100, for example, of a cellular system comprising an antenna 102, a transceiver 106 and an apparatus for interference cancellation 104 between the antenna 102 and the transceiver 106. The antenna 102 is configured to transmit and receive signals to and from the transceiver 106 via the interference cancellation apparatus 104. The transmit signals to be transmitted by the antenna 106 are received from a power amplifier 114, which in some embodiments, is a part of the transceiver 106. The interference cancellation apparatus 104 is located downstream of the antenna 102 and operates to reduce or cancel the interference in a received signal 108. In some embodiments, the interference in the received signal 108 is caused by a transmit signal 109 leaking into the receive signal 108.

The apparatus 104 is configured to receive the receive (Rx) signal 108 from the antenna 102 and receive a transmit (Tx) signal 109 from the power amplifier 114 and generate a cancellation of the interference in the receive signal 108. In one embodiment, the apparatus 104 comprises a cancellation unit 105 configured to receive the receive signal 108 from the antenna 102 and the transmit signal 109 from the power amplifier 114 and cancel a primary portion of the Tx signal 109 from the Rx signal 108, thereby generating an output signal 110 comprising the receive signal 108 and a residual Tx signal. In some embodiments, due to a coupling of the Tx signal 109 and the Rx signal 108 within the cancellation unit 105, the Rx signal 108 contains portions of the Tx signal 109. In some embodiments, the residual Tx signal comprises a residual component of the Tx signal 109.

In some embodiments, as will be more fully appreciated below, the cancellation unit 105 can comprise a first coupling unit configured to receive the transmit (Tx) signal 109 from the output port of the power amplifier 114 and generate an in-phase Tx signal in a first signal path and a quadrature Tx signal in a second signal path. The first coupling unit can further receive the receive (Rx) signal 108 from the antenna 102 and generate an in-phase Rx signal in the second signal path and a quadrature Rx signal in the first signal path. In some embodiments, the cancellation unit 105 can further comprise a receive filter unit, located downstream of the first coupling unit coupled to the first signal path and the second signal path configured to filter the signals in the first signal path and the second signal path, thereby generating an overall quadrature receive signal comprising the quadrature Rx signal and a residual component of the in-phase Tx signal in a third signal path and an overall in-phase receive signal comprising the in-phase Rx signal and a residual component of the quadrature Tx signal in a fourth signal path. Additionally, in some embodiments, the cancellation unit 105 can comprise a second coupling unit configured to receive the overall quadrature receive signal along the third signal path and the overall in-phase receive signal along the fourth signal path, and generate an overall receive signal comprising a desired Rx signal and a residual Tx signal at an output thereof. In some embodiments, the output of the second coupling unit and the output of the cancellation unit 105 are the same.

Still referring to FIG. 1, in some embodiments, the interference cancellation apparatus 104 further comprises a compensation control unit 107 configured to modify one or more signals within the cancellation unit 105, based on the residual Tx signal within the output signal 110 at the output of the cancellation unit 105, in order to reduce the interference (i.e., the residual Tx signal) in the resultant output signal 111 at the Rx input port 113 of the transceiver 106. In some embodiments, the compensation control unit 107 is configured to modify signals in the third signal path and the fourth signal path (to be described later) within the cancellation unit 105. However, in other embodiments, the compensation control unit 107 is configured to modify signals in the first signal path, the second signal path, the third signal path and the fourth signal path. In some embodiments, the compensation control unit 107 can comprise a feedback receiver unit configured to selectively generate a compensation signal based on a measured (or sampled) power of the residual Tx signal at the output of the cancellation unit 105 or a signal associated therewith and a compensation unit configured to modify signals in the first signal path, the second signal path, the third signal path and the fourth signal path, based on the compensation signal, as will be described in greater detail below. In some embodiments, the compensation unit can comprise a first attenuation unit and a first phase shift unit configured to modify the signals in the third signal path or the fourth signal path or both. In some embodiments, the compensation unit can further comprise a second attenuation unit and a second phase shift unit configured to modify the signals in the first signal path or the second signal path or both. In some embodiments, the interference cancellation apparatus 104 further comprises a memory unit 103 coupled to the cancellation unit 105 and the compensation control unit 107, configured to store data associated therewith, for example, measured (or sampled) power of the residual Tx signal. In some embodiments, the memory unit 103 could be a part of the feedback receiver unit. These various embodiments will be more fully appreciated in the discussion of the various following figures.

Figure 2:
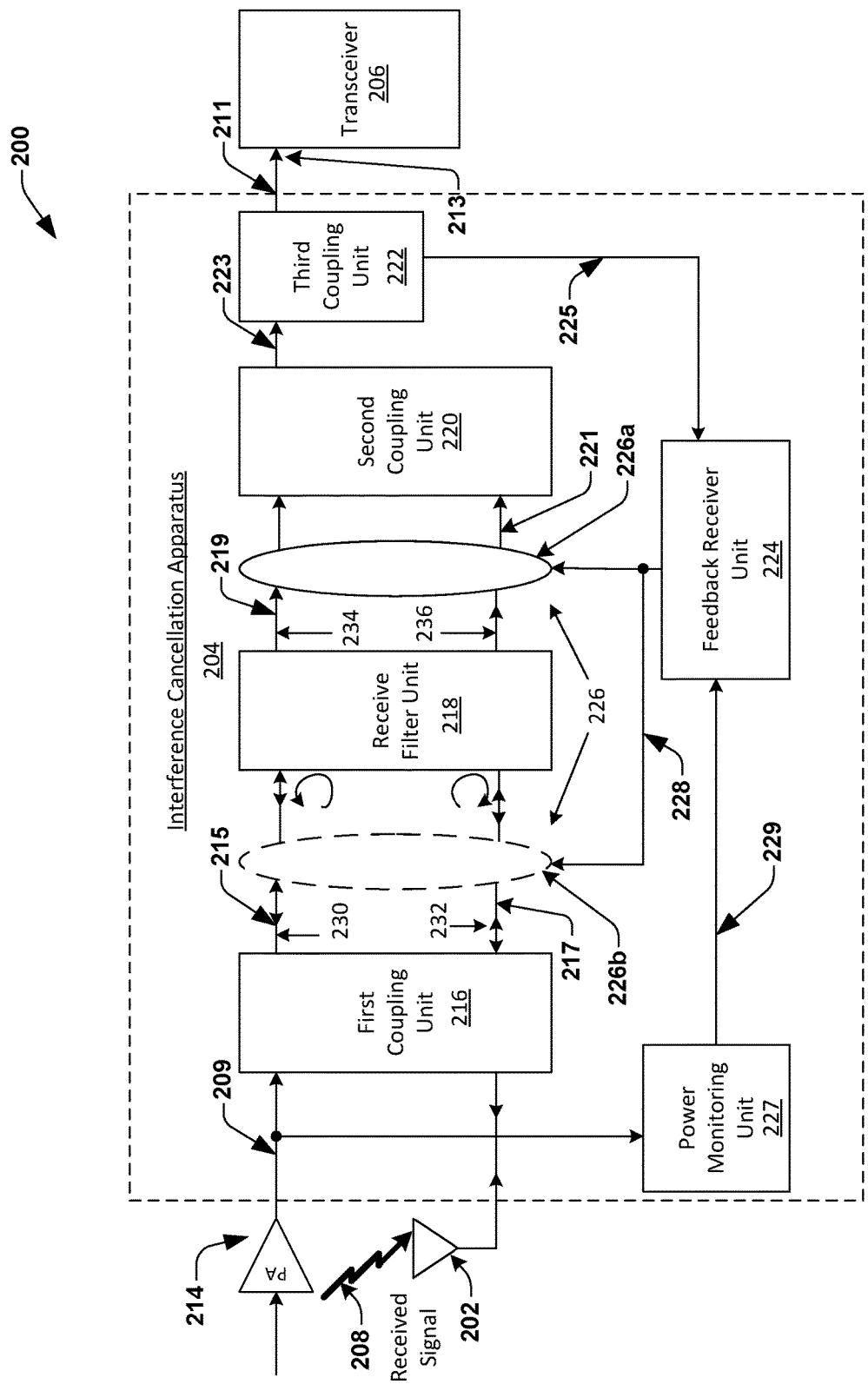
FIG. 2 depicts a block diagram representation of an interference cancellation apparatus 204 in a wireless communication system 200, according to one embodiment of the disclosure.

FIG. 2 depicts a block diagram representation of an interference cancellation apparatus 204 in a wireless communication system 200. The wireless communication system 200 comprises an antenna 202, a transceiver 206 and an interference cancellation apparatus 204 coupled between the antenna 202 and the transceiver 206. The antenna 202 is configured to transmit and receive signals to and from the transceiver 206 via the apparatus 204. The transmit signal 209 to be transmitted by the antenna 202 is received from a power amplifier 214, which in some embodiments, is a part of the transceiver 206. The interference cancellation apparatus 204 is located downstream of the antenna 202 and operates to reduce or cancel the interference in a receive signal 208 to obtain a resultant output signal 211 at an Rx input port 213 of the transceiver 206. In some embodiments, the interference in the receive signal 208 is caused by the transmit signal 209 leaking into the receive signal 208 in a receive signal path.

In some embodiments, the apparatus 204 comprises a first coupling unit 216, a receive filter unit 218, a second coupling unit 220 and a third coupling unit 222. The interference cancellation apparatus 204 further comprises a feedback receiver unit 224 and a compensation unit 226. The apparatus 204 further comprises a power monitoring unit 227 configured to measure a power of the transmit signal 209 at the output of the power amplifier 214. In some embodiments, the power monitoring unit 227 may be a part of the feedback receiver unit 224. The first coupling unit 216 is configured to receive the transmit (Tx) signal 209 from an output port of the power amplifier 214 at a first input thereof and generate an in-phase Tx signal in a first signal path 215 and a quadrature Tx signal in a second signal path 217. The first coupling unit 216 is further configured to receive the receive (Rx) signal 208 from the antenna 202 at a second input thereof and generate an in-phase Rx signal in the second signal path 217 and a quadrature Rx signal in the first signal path 215. Therefore, in such embodiments, the first signal path 215 comprises a first signal 230 comprising the in-phase Tx signal and the quadrature Rx signal, and the second signal path 217 comprises a second signal 232 comprising the in-phase Rx signal and the quadrature Tx signal. In some implementations, the first coupling unit 216 comprises a quadrature hybrid coupler. However, other implementations of the first coupling unit 216 are also contemplated.

The receive filter unit 218 is located downstream of the first coupling unit 216 and is coupled to the first signal path 215 and the second signal path 217 respectively. The receive filter unit 218 in some embodiments, comprises a first receive filter unit coupled to the first signal path 215 and a second receive filter unit coupled to the second signal path 217. The receive filter unit 218 is tuned to a frequency different from that of the transmit signal 209 and therefore the in-phase Tx signal in the first signal path 215 and the quadrature Tx signal in the second signal path 217 get attenuated as it propagates through the receive filter unit 218, thereby generating an overall quadrature receive signal 234 in the third signal path 219 and an overall in-phase receive signal 236 in the fourth signal path 221. In some embodiments, the overall quadrature receive signal 234 in the third signal path 219 comprises the quadrature receive signal and a residual component of the in-phase Tx signal, and the overall in-phase receive signal 236 in the fourth signal path 221 comprises the in-phase receive signal and a residual component of the quadrature Tx signal.

In some embodiments, a primary portion of the in-phase Tx signal in the first signal path 215 and the quadrature Tx signal in the second signal path 217 get reflected at the receive filter unit 218 back to the first coupling unit 216 which get combined at a port feeding the antenna 202. In some embodiments, the port feeding the antenna and the second input port of the first coupling unit 216 are the same. All four ports of the first coupling unit 216 are input/output ports, each of which is configured to receive and transmit signals.

The second coupling unit 220 is located downstream of the receive filter unit 218 and is configured to receive the overall quadrature Rx signal 234 from the third signal path 219 at a first input thereof and the overall in-phase receive signal 236 from the fourth signal path 221 at a second input thereof. The second coupling unit 220 is further configured to generate an overall receive signal 223 comprising an Rx output signal and a residual Tx signal at a first output thereof. In some embodiments, the second coupling unit 220 is configured to generate the overall receive signal 223 based on a combination of the quadrature Rx signal in the third signal path 219 and the in-phase Rx signal in the fourth signal path 221, and a cancellation of the residual component of the in-phase Tx signal in the third signal path 219 and the residual component of the quadrature Tx signal in the fourth signal path 221. The second coupling unit 220 comprises four ports, each of which are input/output ports configured to receive and transmit signals.

In some embodiments, the residual Tx signal in the overall receive signal 223 is generated due to an imperfect cancellation of the residual component of the in-phase Tx signal in the third signal path 219 and the residual component of the quadrature Tx signal in the fourth signal path 221 at the second coupling unit 220. In some embodiments, the imperfect cancellation at the second coupling unit 220 can be due to imperfections in the second coupling unit 220 or the first coupling unit 216 or the receive filter unit 218. In some embodiments, this can result in the in-phase signals and the quadrature signals in the first signal path 215 and the second signal path 217, and the third signal path 219 and the fourth signal path 221, respectively being not in perfect quadrature, which further leads to the imperfect cancellation of the residual Tx signal. Thus, in order to reduce the residual Tx signal in the overall receive signal 223, a compensation circuitry, including the feedback receiver unit 224 and the compensation unit 226 is introduced in this disclosure.

The third coupling unit 222 is located downstream of the second coupling unit 220 and is configured to receive the overall receive signal 223 from the second coupling unit 220 at an input thereof. In some embodiments, the third coupling unit 222 is configured to sample the residual Tx signal from the overall receive signal 223 to generate a residual Tx output signal 225 at a first output thereof and convey the overall receive signal 211 to an Rx input port 213 of the transceiver 206 via a second output thereof. In some embodiments, the overall receive signal 211 and the overall receive signal 223 are the same. Further, in some embodiments, the residual Tx signal in the overall receive signal 223 and the residual Tx output signal 225 are the same.

The feedback receiver unit 224 comprises an input configured to receive the residual Tx output signal 225 from the first output of the third coupling unit 222 and selectively generate a compensation signal 228 for compensating the overall in-phase receive signal 236 in the fourth signal path 221 or the overall quadrature receive signal 234 in the third signal path 219 or both, based on the residual Tx output signal 225. In some embodiments, the compensation signal 228 is further used for compensating the first signal 230 comprising the in-phase Tx signal and the quadrature Rx signal in the first signal path 215, and the second signal 232 comprising the in-phase Rx signal and the quadrature Tx signal in the second signal path 217. In some embodiments, the compensation signal 228 is generated by comparing the residual Tx output signal 225 with a predetermined threshold in the feedback receiver unit 224. For example, in some embodiments, the feedback receiver unit 224 generates the compensation signal 228 selectively, when a measured power of the residual Tx output signal 225 exceeds a predetermined residual power. In some embodiments, the power monitoring unit 227 is configured to measure a power of the transmit signal 209 at the output of the power amplifier 214 and generate a control signal 229 that selectively activates the feedback receiver unit 224 when the measured power of the transmit signal 209 exceeds a predetermined transmit power. Thus, in at least one embodiment, the power monitoring unit 227 is operable to deactivate the compensation if the transmit power is less than a predetermined threshold, and enable such compensation at higher transmit powers. In some embodiments, the power monitoring unit 227 could be implemented as a part of the feedback receiver unit 224.

The compensation unit 226 is configured to receive the compensation signal 228 from the feedback receiver unit 224 and modify the first signal 230, the second signal 232, the overall in-phase receive signal and the overall quadrature receive signal, based on the compensation signal 228. In some embodiments, the compensation unit comprises a first compensation unit 226a coupled to the third signal path 219 and the fourth signal path 221, and configured to modify the overall in-phase receive signal in the fourth signal path 221 or the overall quadrature receive signal in the third signal path 219 or both, based on the compensation signal 228. In some embodiments, the compensation unit 226 further comprises a second compensation unit 226b coupled to the first signal path 215 and the second signal path 217 respectively and configured to modify the first signal 230 or the second signal 232 or both, based on the compensation signal 228.

Figure 3:
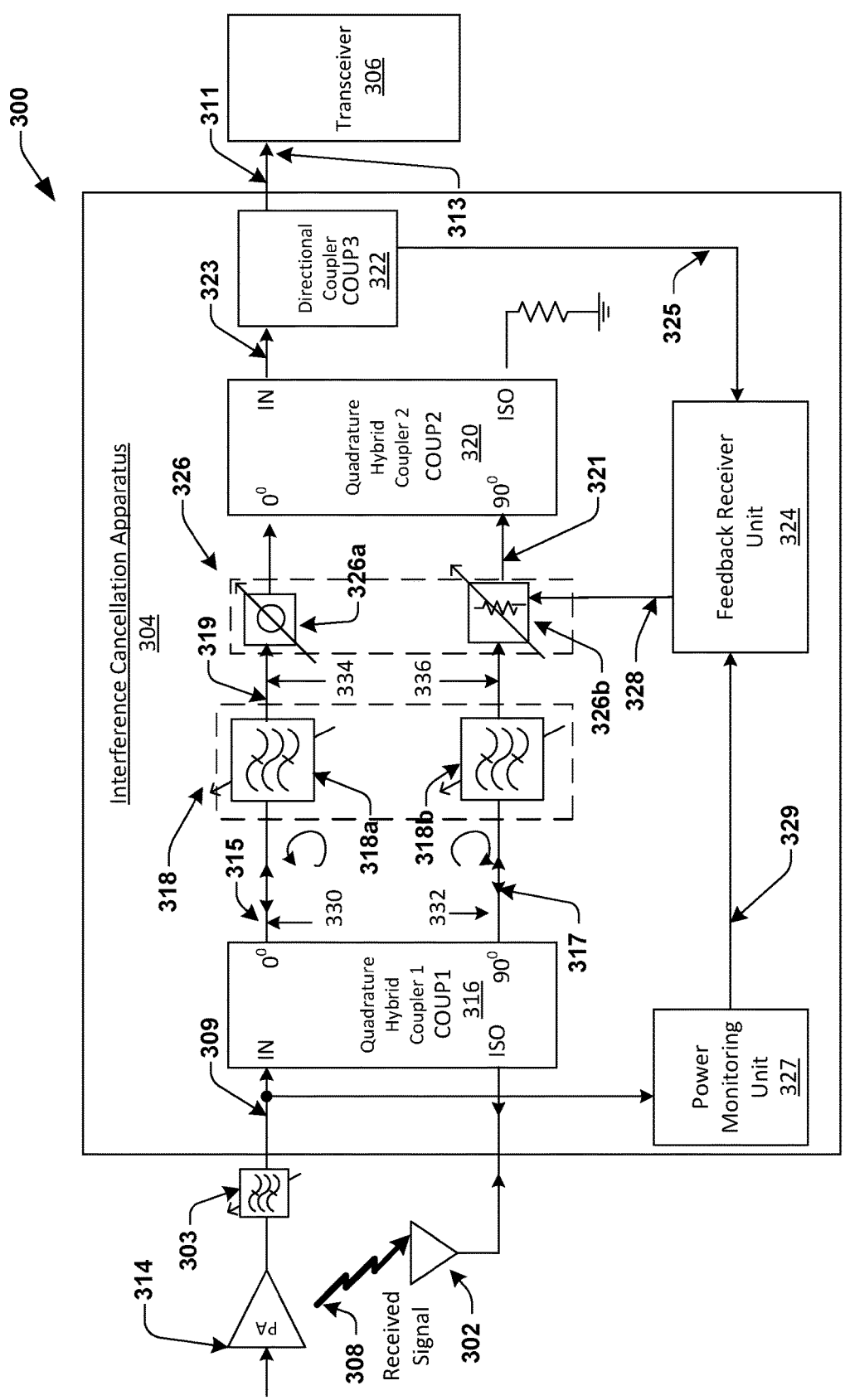
FIG. 3 shows an example implementation of a wireless communication system 300 comprising an interference cancellation apparatus, according to one embodiment of the disclosure.

FIG. 3 shows an example implementation of a wireless communication system 300 comprising an interference cancellation apparatus 304, according to one embodiment of the disclosure. The wireless communication system 300 comprises an antenna 302, a transceiver 306 and an interference cancellation apparatus 304 between the antenna 302 and the transceiver 306. The antenna 302 is configured to transmit and receive signals to and from the transceiver 306 via the apparatus 304. In some embodiments, the antenna 302 is configured to receive a receive signal 308 and convey it to the transceiver 306 via the interference cancellation apparatus 304. A transmit signal 309 to be transmitted by the antenna 306 is received from a power amplifier 314, which in some embodiments, is a part of the transceiver 306. In some embodiments, the interference cancellation apparatus 304 is configured to receive the transmit signal 309 from the power amplifier 314 via a Tx filter 303 prior to transmitting the transmit signal 309 via the antenna 302.

The apparatus 304 is located downstream of the antenna 302 and operates to reduce or cancel an interference in a receive signal 308 thereby generating a resultant output signal 311 at an Rx input port 313 of the transceiver 306. In some embodiments, the interference in the receive signal 308 is caused by the transmit signal 309 leaking into the receive signal 308 in a receive signal path. The interference cancellation apparatus 304 comprises a first coupling unit 316, a receive filter unit 318, a second coupling 320 and a third coupling unit 322. The apparatus 304 further comprises a feedback receiver unit 324 and a compensation unit 326. In some embodiments, the apparatus 304 further comprises a power monitoring unit 327 configured to measure a power of the transmit signal 309 at an output of the power amplifier 314.

In some embodiments, the first coupling unit 316 comprises a first quadrature hybrid coupler, COUP1 comprising four ports IN, ISO, 0° and 90° All four ports of the quadrature hybrid coupler, COUP1 comprises input/output (I/O) ports which can be used as input ports or output ports or both in different embodiments. The first quadrature hybrid coupler, COUP1 in FIG. 3 is configured to receive the transmit (Tx) signal 309 from an output port of the power amplifier 314 at a first input thereof, for example the IN port and generate an in-phase Tx signal in a first signal path 315 and a quadrature Tx signal in a second signal path 317. The first quadrature hybrid coupler, COUP1 is further configured to receive the receive (Rx) signal 308 from the antenna 302 at a second input thereof, for example, the ISO port and generate an in-phase Rx signal in the second signal path 317 and a quadrature Rx signal in the first signal path 315. Therefore, in such embodiments, the first signal path 315 comprises a first signal 330 comprising the in-phase Tx signal and the quadrature Rx signal, and the second signal path 317 comprises a second signal 332 comprising the in-phase Rx signal and the quadrature Tx signal.

The receive filter unit 318 is located downstream of the first quadrature hybrid coupler, COUP1 and is coupled to the first signal path 315 and the second signal path 317 respectively. The receive filter unit 318 in some embodiments, comprises a first receive filter unit 318a coupled to the first signal path 315 and a second receive filter unit 318b coupled to the second signal path 317. The first receive filter unit 318a and the second receive filter unit 318b are tuned to a frequency different from that of the transmit signal 309 and therefore the in-phase Tx signal in the first signal path 315 gets attenuated as it propagates through the first receive filter unit 318a and the quadrature Tx signal in the second signal path 317 gets attenuated as it propagates through the second receive filter unit 318b, thereby generating an overall quadrature receive signal 334 in the third signal path 319 and an overall in-phase receive signal 336 in the fourth signal path 321. In some embodiments, the overall quadrature receive signal 334 in the third signal path 319 comprises the quadrature receive signal from the first signal path and a residual component of the in-phase Tx signal, and the overall in-phase receive signal 336 in the fourth signal path 221 comprises the in-phase receive signal from the second signal path and a residual component of the quadrature Tx signal.

In some embodiments, a primary portion of the in-phase Tx signal in the first signal path 315 and the quadrature Tx signal in the second signal path 317 gets reflected at the first receive filter unit 318a and the second receive filter unit 318b, respectively, back to the first quadrature hybrid coupler, COUP1. In some embodiments, the in-phase Tx signal in the first signal path 315 is reflected back to the 0° port and the quadrature Tx signal in the second signal path 317 is reflected back to the 90° port which gets combined at a port feeding the antenna 302, for example the ISO port of the COUP1. In this embodiment, the ISO port of the COUP1 is configured to feed the antenna 302 as well as receive the Rx signal 308 from the antenna 302. In other embodiments, however, each of the four ports IN, ISO, 0° and 90° of COUP1 may be configured differently than above.

In some embodiments, the second coupling unit 320 comprises a second quadrature hybrid coupler, COUP2 comprising four ports IN, ISO, 0° and 90° All four ports of the quadrature hybrid coupler, COUP2 comprises input/output (I/O) ports which can be used as input ports or output ports in different embodiments. The second quadrature hybrid coupler, COUP2 in FIG. 3 is located downstream of the receive filter unit 318 and is configured to receive the overall quadrature Rx signal 334 from the third signal path 319 at a first input thereof, for example the 0° port and the overall in-phase receive signal 336 from the fourth signal path 321 at a second input thereof, for example the 90° port. The second quadrature hybrid coupler, COUP2 is further configured to generate an overall receive signal 323 comprising an Rx output signal and a residual Tx signal at a first output thereof, for example, the IN port. In some embodiments, the second quadrature hybrid coupler, COUP2 is configured to generate the overall receive signal 323 based on a combination of the quadrature Rx signal in the third signal path 319 and the in-phase Rx signal in the fourth signal path 321, and a cancellation of the residual component of the in-phase Tx signal in the third signal path 319 and the residual component of the quadrature Tx signal in the fourth signal path 321.

The third coupling unit 322 comprises a directional coupler, COUP3 comprising three input/output (I/O) ports. In this embodiment, one of the three I/O ports of the COUP3 is configured to operate as an input port and the remaining two I/O ports of the COUP3 are configured to operate as output ports. However, in other embodiments, each of the three I/O ports of the COUP3 can be configured differently. The directional coupler, COUP3 is located downstream of the second quadrature hybrid coupler, COUP2 and is configured to receive the overall receive signal 323 from the second quadrature hybrid coupler, COUP2 at an input thereof. In some embodiments, the directional coupler, COUP3 is configured to sample the residual Tx signal from the overall receive signal 323 to generate a residual Tx output signal 325 at a first output thereof and convey the overall receive signal 311 to an Rx input port 313 of the transceiver 306 via a second output thereof. In some embodiments, the overall receive signal 311 and the overall receive signal 323 are the same.

The feedback receiver unit 324 comprises an input configured to receive the residual Tx output signal 325 from the first output of the directional coupler, COUP3 and selectively generate a compensation signal 328 for compensating the overall in-phase receive signal in the fourth signal path 321 or the overall quadrature receive signal in the third signal path 319 or both, based on the residual Tx output signal 325. In some embodiments, the compensation signal 328 is generated by comparing the residual Tx output signal 325 with a predetermined threshold and employing a search algorithm within the feedback receiver unit 324. For example, in some embodiments, the feedback receiver unit 324 generates the compensation signal 328 selectively, when a measured power of the residual Tx output signal 325 exceeds a predetermined residual power. In some embodiments, the power monitoring unit 327 is configured to measure a power of the transmit signal 309 at the output of the power amplifier 314 and generate a control signal 329 that selectively activates the feedback receiver unit 324 when the measured power of the transmit signal 309 exceeds a predetermined transmit power.

The compensation unit 326 is configured to receive the compensation signal 328 from the feedback receiver unit 324 and modify the overall in-phase receive signal 336 in the fourth signal path 321 or the overall quadrature receive signal 334 in the third signal path 319 or both, based on the compensation signal 328. In some embodiments, the compensation unit 326 comprises a phase shift unit 326a coupled to the third signal path 319 and configured to adjust a phase of the overall quadrature receive signal 334 in the third signal path 319. The compensation unit 326 further comprises an attenuation unit 326b coupled to the fourth signal path 321 and configured to adjust an amplitude of the overall in-phase receive signal 336 in the fourth signal path 321. The compensation unit 326 in FIG. 3 shows one non-limiting example of implementing an attenuation or phase shift to the signals in the third signal path 319 and the fourth signal path 321 respectively. However, in other embodiments, all different combinations of the attenuation unit 326b and the phase shift unit 326a in the third signal path 319 and fourth signal path 321 is contemplated. For example, in one embodiment, the compensation unit 326 can comprise an attenuation unit and a phase shift unit in the third signal path 319 and in another embodiment, the compensation unit 326 can comprise an attenuation unit and a phase shift unit in the fourth signal path 321. Further, in another embodiment, the compensation unit 326 can comprise an attenuation unit in the third signal path 319 and a phase shift unit in the fourth signal path 321.

Figure 4:
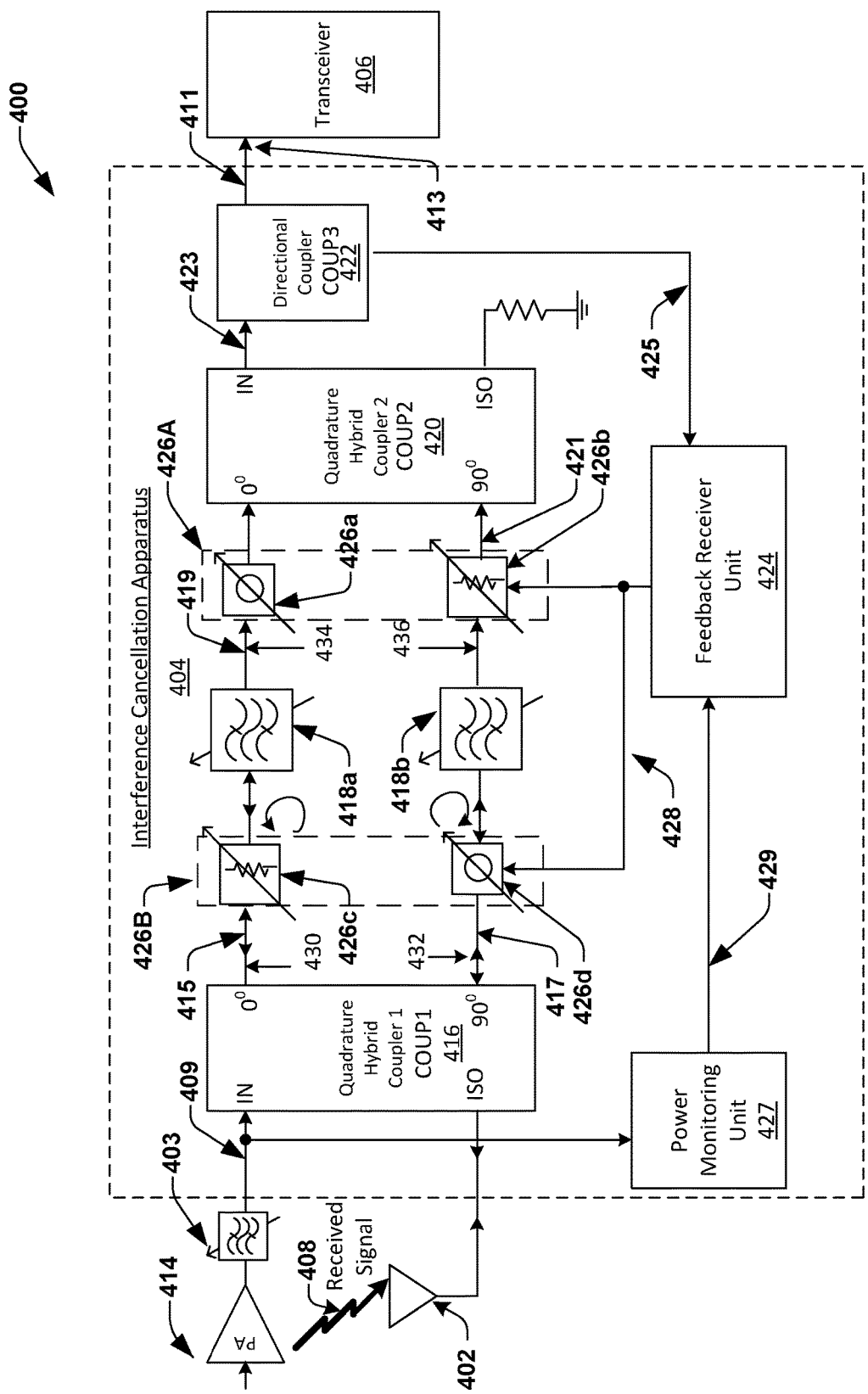
FIG. 4 shows an example implementation of a wireless communication system 400 comprising an interference cancellation apparatus, according to another embodiment of the disclosure.

FIG. 4 shows an example implementation of a wireless communication system 400 comprising an interference cancellation apparatus, according to another embodiment of the disclosure. The wireless communication system 400 comprises an antenna 402, a transceiver 406 and an interference cancellation apparatus 404 between the antenna 402 and the transceiver 406. The antenna 402 is configured to transmit and receive signals to and from the transceiver 406 via the interference cancellation apparatus 404. In some embodiments, the antenna 402 is configured to receive a receive signal 408 and convey it to the transceiver 406 via the interference cancellation apparatus 404. A transmit signal 409 to be transmitted by the antenna 406 is received from a power amplifier 414, which in some embodiments, is a part of the transceiver 406. In some embodiments, the interference cancellation apparatus 404 is configured to receive the transmit signal 409 from the power amplifier 414 via a Tx filter 403 prior to transmitting the transmit signal 409 via the antenna 402.

The interference cancellation apparatus 404 in FIG. 4 is similar to the interference cancellation apparatus 300 in FIG. 3, with the exception of the compensation unit 326. The interference cancellation apparatus 404 comprises a first compensation unit 426A configured to modify the overall in-phase receive signal 436 in the fourth signal path 421 or the overall quadrature receive signal 434 in the third signal path 419 or both, based on a compensation signal 428 from a feedback receiver unit 424. The interference cancellation apparatus 404 further comprises a second compensation unit 426B configured to modify the first signal 430 in the first signal path 415 or the second signal 432 in the second signal path 419 or both, based on the compensation signal 428 from the feedback receiver unit 424. In some embodiments, the first compensation unit 426A comprises a phase unit 426a coupled to the third signal path 419 and configured to adjust a phase of the overall quadrature receive signal 434 in the third signal path 419. The first compensation unit 426A further comprises an attenuation unit 426b coupled to the fourth signal path 421 and configured to adjust an amplitude of the overall in-phase receive signal 436 in the fourth signal path 421. However, in other embodiments, all different combinations of the attenuation unit 426b and the phase shift unit 426a in the third signal path 419 and fourth signal path 421 is contemplated. In some embodiments, the second compensation unit 426B comprises a phase unit 426d coupled to the second signal path 417 and configured to adjust a phase of the second signal 432 in the second signal path 417. The second compensation unit 426B further comprises an attenuation unit 426c coupled to the first signal path 415 and configured to adjust an amplitude of the first signal 430 in the first signal path 415. However, in other embodiments, all different combinations of the—attenuation unit 426c and the phase shift unit 426d in the first signal path 415 and the second signal path 417 as discussed above with respect to FIG. 3, is also contemplated.

Figure 5:
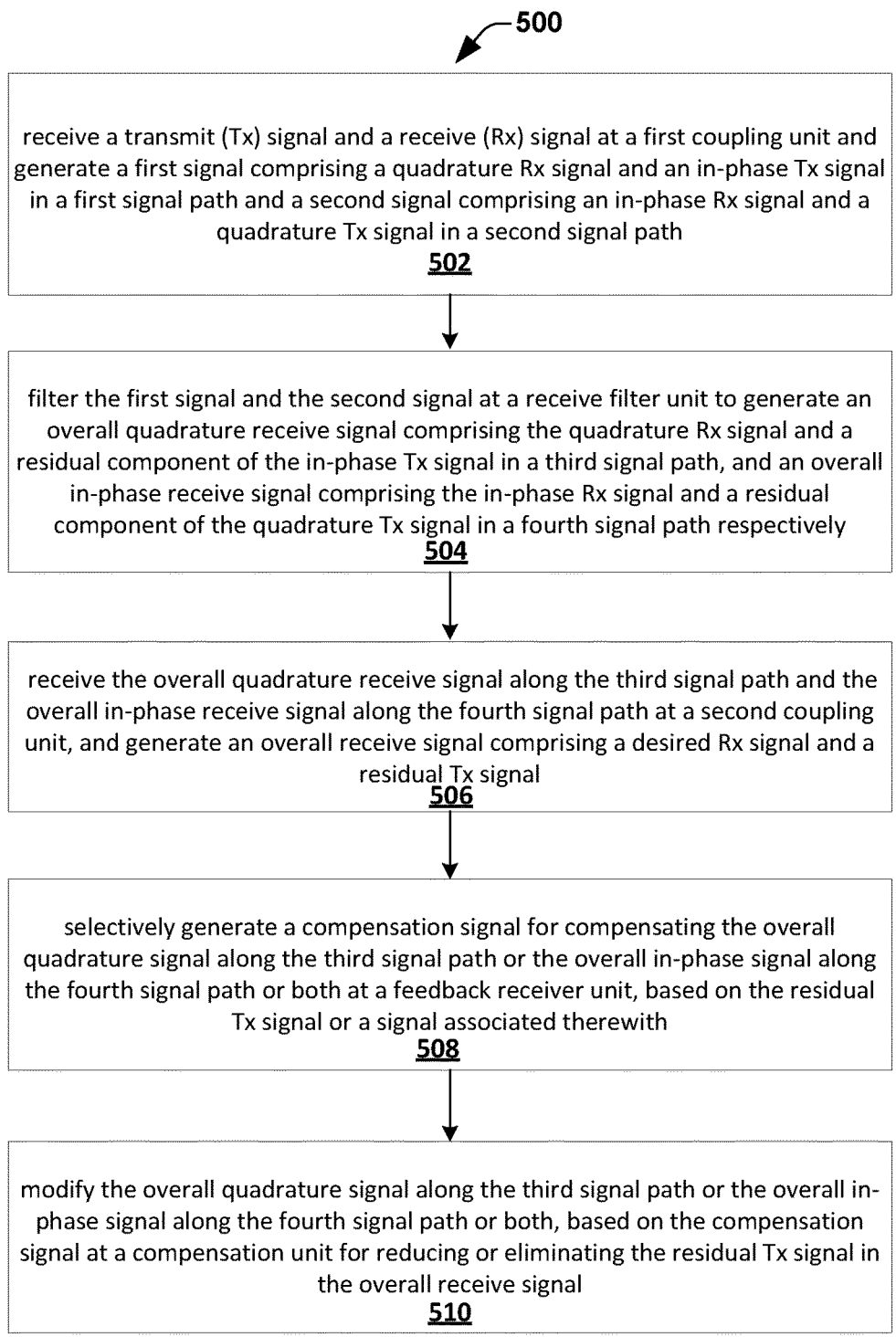
FIG. 5 shows a flowchart of a method 500 for interference cancellation in a wireless communication system, according to one embodiment of the disclosure.

FIG. 5 shows a flowchart of a method 500 for interference cancellation in a wireless communication system, according to one embodiment of the disclosure. The method 500 is described herein with reference to the wireless communication system 300 illustrated in FIG. 3. At 502, the transmit (Tx) signal 309 and the receive (Rx) signal 308 are received at the first coupling unit 316 and a first signal 330 comprising a quadrature Rx signal and an in-phase Tx signal is generated in the first signal path 315 and a second signal 332 comprising an in-phase Rx signal and a quadrature Tx signal is generated in the second signal path 317. At 504, the first signal 330 and the second signal 332 are filtered by a receive filter unit 318 and an overall quadrature receive signal 334 comprising the quadrature Rx signal and a residual component of the in-phase Tx signal is generated in a third signal path 319, and an overall in-phase receive signal 336 comprising the in-phase Rx signal and a residual component of the quadrature Tx signal are generated in a fourth signal path 336. At 506, the overall quadrature receive signal 334 along the third signal path 319 and the overall in-phase receive signal 336 along the fourth signal path 321 are received at a second coupling unit 320, and an overall receive signal 323 comprising a desired Rx signal and a residual Tx signal is generated at an output thereof. At 508, a compensation signal 328 for compensating the overall quadrature signal 334 along the third signal path 319 or the overall in-phase signal 336 along the fourth signal path 321 or both is selectively generated at a feedback receiver unit 324, based on the residual Tx signal or a signal associated therewith. At 510, the overall quadrature signal 334 along the third signal path 319 or the overall in-phase signal 336 along the fourth signal path 321 or both is modified based on the compensation signal 328 at a compensation unit 326 in order to reduce or eliminate the residual Tx signal in the overall receive signal 311.

Figure 6:
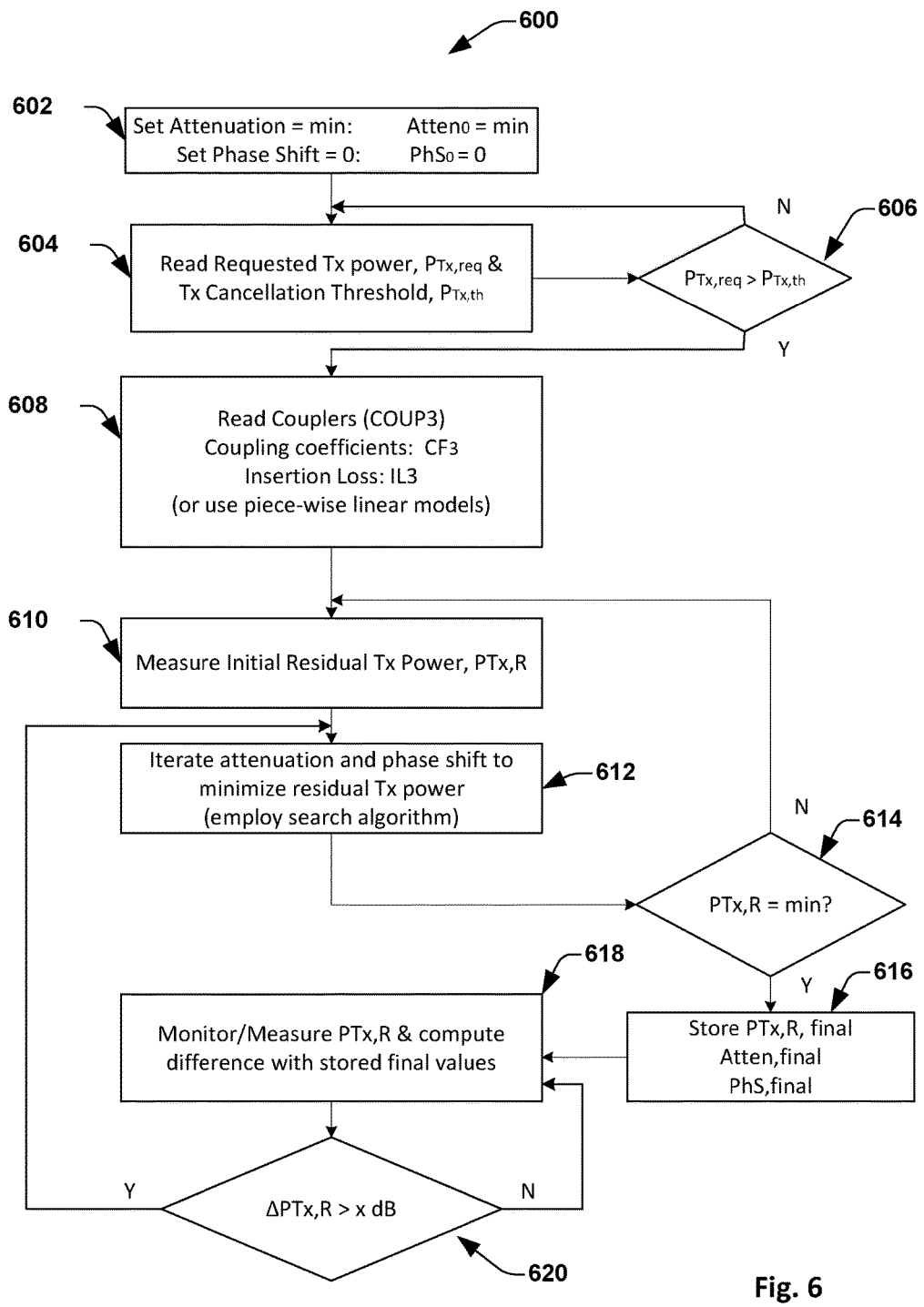
FIG. 6 shows an example implementation of the algorithm 600 for enabling a closed loop control of the cancellation parameters i.e., the attenuation and the phase shift, according to one embodiment of the disclosure.

FIG. 6 shows an example implementation of an algorithm 600 for enabling a closed loop control of the cancellation parameters i.e., the attenuation and the phase shift, according to one embodiment of the disclosure. The algorithm herein is described with reference to the wireless communication system 300 illustrated in FIG. 3, however, in other embodiments, the same algorithm could to applied to other systems, for example, the wireless communication system 400 in FIG. 4. In some embodiments, the algorithm relies on search techniques to find the values of attenuation and phase shift that lead to minimize the residual Tx signal in the overall receive signal 323. In one embodiment, this algorithm can be implemented using a controller within the feedback receiver unit 324 in FIG. 3. At 602, the attenuator 326b and the phase shifter 326a are set to an initial value. At 604, a requested Tx power, PTx,req (for example, the power of the signal 309) at the output of the power amplifier 314 and a predetermined cancellation threshold, PTx,th is read. At 606, a determination whether the PTx,req (transmit signal power) is greater than the PTx,th is performed. If yes, the method 600 proceeds to 608. Otherwise, the method loops back to 604. At 608, parameters of the coupler COUP3 are read. At 610, the residual Tx output signal 325 is measured and the amplitude and phase of the PTx,R 325 is determined. At 612, the attenuation and the phase shift provided by the attenuator 326b and the phase shifter 326a respectively are iterated in order to minimize the residual Tx output signal 325, by employing a search algorithm. At 614, a determination whether the residual Tx output signal 325 has reached a minimum value is performed. If No, the method proceeds to the next iteration at 610, where the residual Tx output signal 325 is measured again. If Yes, the method proceeds to 616, where the computation is stopped and a final value of PTx,R 325 is stored. At 618, a monitor mode is entered wherein PTx,R 330 is measured and a difference between the final values of PTx,R 325 and the current value of PTx,R 325 is computed. At 620, a determination whether the computed difference is greater than a threshold value is performed. If yes, the method loops back to 612 where the attenuation and the phase shift are iterated again until convergence is obtained. If No, the method loops back to 618.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is apparatus for interference cancellation in a wireless communication system, comprising a cancellation unit configured to receive a transmit (Tx) signal from an output port of a power amplifier and a receive (Rx) signal from an antenna, wherein due to a coupling of the Tx signal and the Rx signal within the cancellation unit, the Rx signal contains portions of the Tx signal, and generate a cancellation of a primary portion of the Tx signal from the Rx signal at an output thereof, leaving a residual portion as a residual Tx signal in the Rx signal, wherein the Rx signal that is output from the cancellation unit is coupled to an Rx input port of a transceiver; and a compensation control unit configured to modify one or more signals within the cancellation unit, based on the residual Tx signal at the output of the cancellation unit, wherein the modification of the one or more signals results in a reduction or an elimination of the residual Tx signal at the output of the cancellation unit.

Example 2 is an apparatus including the subject matter of example 1, wherein the cancellation unit comprises a first coupling unit configured to receive the transmit (Tx) signal from the output port of the power amplifier and generate an in-phase Tx signal in a first signal path and a quadrature Tx signal in a second signal path; and receive the receive (Rx) signal from the antenna and generate an in-phase Rx signal in the second signal path and a quadrature Rx signal in the first signal path; a receive filter unit coupled to the first signal path and the second signal path and configured to generate an overall quadrature receive signal comprising the quadrature Rx signal and a residual component of the in-phase Tx signal in a third signal path, and generate an overall in-phase receive signal comprising the in-phase Rx signal and a residual component of the quadrature Tx signal in a fourth signal path; and a second coupling unit configured to receive the overall quadrature receive signal along the third signal path and the overall in-phase receive signal along the fourth signal path, and generate an overall receive signal comprising an Rx output signal and the residual Tx signal at an output thereof.

Example 3 is an apparatus including the subject matter of examples 1-2, including or omitting elements, wherein the compensation control unit comprises, a feedback receiver unit configured to selectively generate a compensation signal based on a measured power of the residual Tx signal or a signal associated therewith; and a compensation unit configured to modify the overall in-phase receive signal or the overall quadrature receive signal or both, based on the compensation signal.

Example 4 is an apparatus including the subject matter of examples 1-3, including or omitting elements, further comprising a third coupling unit coupled to the first output of the second coupling unit configured to receive the overall receive signal and sample the residual Tx signal from the overall receive signal to generate a residual Tx output signal at a first output thereof and convey the overall receive signal to an Rx input port of a transceiver via a second output thereof.

Example 5 is an apparatus including the subject matter of examples 1-4, including or omitting elements, wherein the feedback receiver unit is configured to receive the residual Tx output signal from the first output of the third coupling unit, and generate the compensation signal for compensating the overall in-phase receive signal or the overall quadrature receive signal or both, based on retrieving a value associated with the residual Tx output signal from a memory unit associated therewith.

Example 6 is an apparatus including the subject matter of examples 1-5, including or omitting elements, wherein the compensation unit comprises an attenuation unit coupled to the third signal path or the fourth signal path, and configured to provide an attenuation to the overall quadrature receive signal or the overall in-phase receive signal respectively, based on the compensation signal.

Example 7 is an apparatus including the subject matter of examples 1-6, including or omitting elements, wherein the compensation unit further comprises a phase shift unit coupled to the third signal path or the fourth signal path, and configured to provide a phase shift to the overall quadrature receive signal or the overall in-phase receive signal respectively, based on the compensation signal.

Example 8 is an apparatus including the subject matter of examples 1-7, including or omitting elements, wherein the feedback receiver unit is configured to selectively generate the compensation signal based on a predetermined condition.

Example 9 is an apparatus including the subject matter of examples 1-8, including or omitting elements, wherein the predetermined condition comprises the measured power of the residual Tx signal or the signal associated therewith exceeding a predetermined threshold.

Example 10 is an apparatus including the subject matter of examples 1-9, including or omitting elements, wherein the feedback receiver unit is configured to operate in a correction mode when the measured power of the residual Tx signal or the signal associated therewith exceeds a predetermined threshold, wherein the feedback receiver unit is configured to generate the compensation signal; and a monitor mode when the measured power of the residual Tx signal or the signal associated therewith falls below the predetermined threshold, wherein the feedback receiver unit is configured to dynamically monitor the power of the residual Tx signal or the signal associated therewith.

Example 11 is an apparatus including the subject matter of examples 1-10, including or omitting elements, wherein the compensation unit is further configured to modify a first signal comprising the quadrature Rx signal and the in-phase Tx signal in the first signal path or a second signal comprising the in-phase Rx signal and the quadrature Tx signal in the second signal path or both, based on the compensation signal.

Example 12 is an apparatus including the subject matter of examples 1-11, including or omitting elements, wherein the compensation unit comprises an attenuation unit coupled to the first signal path or the second signal path, and configured to provide an attenuation to the first signal or the second signal respectively, based on the compensation signal.

Example 13 is an apparatus including the subject matter of examples 1-12, including or omitting elements, wherein the compensation unit comprises a phase shift unit coupled to the first signal path or the second signal path, and configured to provide a phase shift to the first signal or the second signal respectively, based on the compensation signal.

Example 14 is an apparatus including the subject matter of examples 1-13, including or omitting elements, further comprising a power monitoring unit configured to measure a power of the transmit signal from the output port of the power amplifier and selectively activate the compensation control unit, based on the measured power of the transmit signal.

Example 15 is an apparatus including the subject matter of examples 1-14, including or omitting elements, wherein the power monitoring system is configured to activate the compensation control unit when the measured power of the transmit signal exceeds a predetermined power.

Example 16 is an apparatus for interference cancellation in a wireless communication system, comprising a first coupling unit configured to receive a transmit (Tx) signal from an output port of a power amplifier and generate an in-phase Tx signal in a first signal path and a quadrature Tx signal in a second signal path; and receive a receive (Rx) signal from an antenna and generate an in-phase Rx signal in the second signal path and a quadrature Rx signal in the first signal path; a receive filter unit coupled to the first signal path and the second signal path and configured to generate an overall quadrature receive signal comprising the quadrature Rx signal and a residual component of the in-phase Tx signal in a third signal path, and generate an overall in-phase receive signal comprising the in-phase Rx signal and a residual component of the quadrature Tx signal in a fourth signal path; a second coupling unit configured to receive the overall quadrature receive signal along the third signal path and the overall in-phase receive signal along the fourth signal path, and generate an overall receive signal comprising a desired Rx signal and a residual Tx signal at an output thereof; a feedback receiver unit configured to selectively generate a compensation signal based on a measured power of the residual Tx signal or a signal associated therewith; and a compensation unit configured to modify the overall in-phase receive signal or the overall quadrature receive signal or both, based on the compensation signal.

Example 17 is an apparatus including the subject matter of example 16, wherein the first coupling unit comprises a quadrature hybrid coupler configured to receive the transmit (Tx) signal from the output port of the power amplifier at a first input and generate the in-phase Tx signal at a first output thereof and the quadrature Tx signal at a second output thereof; and receive the receive (Rx) signal from the antenna at a second input and generate the in-phase Rx signal at the second output thereof and the quadrature Rx signal at the first output thereof.

Example 18 is an apparatus including the subject matter of examples 16-17, including or omitting elements, wherein the receive filter unit comprises a first receive filter unit coupled to the first signal path configured to filter out the in-phase Tx signal in the first signal path and generate the overall quadrature receive signal at an output thereof, and a second receive filter unit coupled to the second signal path configured to filter out the quadrature Tx signal in the second signal path and generate the overall in-phase receive signal at an output thereof.

Example 19 is an apparatus including the subject matter of examples 16-18, including or omitting elements, wherein the first receive filter unit and the second receive filter unit are tunable.

Example 20 is an apparatus including the subject matter of examples 16-19, including or omitting elements, wherein the second coupling unit comprises a quadrature hybrid coupler configured to receive the overall quadrature receive signal along the third signal path at a first input thereof and receive the overall in-phase receive signal along the fourth signal path at a second input thereof, and generate the overall receive signal comprising the desired Rx signal and the residual Tx signal at a first output thereof, wherein the desired Rx signal comprises a combination of the in-phase Rx signal and the quadrature Rx signal.

Example 21 is an apparatus including the subject matter of examples 16-20, including or omitting elements, further comprising a third coupling unit comprising a directional coupler coupled to the first output of the second coupling unit, and configured to receive the overall receive signal and sample the residual Tx signal from the overall receive signal to generate a residual Tx output signal at a first output thereof and convey the overall receive signal to an Rx input port of a transceiver via a second output thereof.

Example 22 is an apparatus including the subject matter of examples 16-21, including or omitting elements, wherein the compensation unit is further configured to modify a first signal comprising the quadrature Rx signal and the in-phase Tx signal in the first signal path or a second signal comprising the in-phase Rx signal and the quadrature Tx signal in the second signal path or both, based on the compensation signal.

Example 23 is a method for interference cancellation in a wireless communication system, comprising receiving a transmit (Tx) signal and a receive (Rx) signal at a first coupling unit and generating a first signal comprising a quadrature Rx signal and an in-phase Tx signal in a first signal path and a second signal comprising an in-phase Rx signal and a quadrature Tx signal in a second signal path; filtering the first signal and the second signal at a receive filter unit to generate an overall quadrature receive signal comprising the quadrature Rx signal and a residual component of the in-phase Tx signal in a third signal path, and an overall in-phase receive signal comprising the in-phase Rx signal and a residual component of the quadrature Tx signal in a fourth signal path respectively; receiving the overall quadrature receive signal along the third signal path and the overall in-phase receive signal along the fourth signal path at a second coupling unit, and generating an overall receive signal comprising a desired Rx signal and a residual Tx signal; selectively generating a compensation signal for compensating the overall quadrature signal along the third signal path or the overall in-phase signal along the fourth signal path or both at a feedback receiver unit, based on the residual Tx signal or a signal associated therewith; and modifying the overall quadrature signal along the third signal path or the overall in-phase signal along the fourth signal path or both, based on the compensation signal at a compensation unit for reducing or eliminating the residual Tx signal in the overall receive signal.

Example 24 is a method including the subject matter of example 23, wherein the compensation signal is further configured to compensate the first signal along the first signal path or the second signal along the second signal path or both.

Example 25 is an apparatus including the subject matter of examples 23-24, including or omitting elements, further comprising sampling the residual Tx signal in the overall receive signal at a third coupling unit to generate a residual Tx output signal and feeding the residual Tx output signal to the feedback receiver unit, prior to generating the compensation signal.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. An apparatus for interference cancellation in a wireless communication system, comprising:
   a cancellation unit configured to:
      receive a transmit (Tx) signal from an output port of a power amplifier and a receive (Rx) signal from an antenna, wherein due to a coupling of the Tx signal and the Rx signal within the cancellation unit, the Rx signal contains portions of the Tx signal, and
      generate a cancellation of a primary portion of the Tx signal from the Rx signal at an output thereof, leaving a residual portion as a residual Tx signal in the Rx signal, wherein the Rx signal that is output from the cancellation unit is coupled to an Rx input port of a transceiver; and
   a compensation control unit configured to modify one or more signals within the cancellation unit, based on the residual Tx signal at the output of the cancellation unit, wherein the modification of the one or more signals results in a reduction or an elimination of the residual Tx signal at the output of the cancellation unit,
   wherein the cancellation unit comprises:
      a first coupling unit configured to:
         receive the transmit (Tx) signal from the output port of the power amplifier and generate an in-phase Tx signal in a first signal path and a quadrature Tx signal in a second signal path; and
         receive the receive (Rx) signal from the antenna and generate an in-phase Rx signal in the second signal path and a quadrature Rx signal in the first signal path;
      a receive filter unit coupled to the first signal path and the second signal path and configured to:
         generate an overall quadrature receive signal comprising the quadrature Rx signal and a residual component of the in-phase Tx signal in a third signal path, and
         generate an overall in-phase receive signal comprising the in-phase Rx signal and a residual component of the quadrature Tx signal in a fourth signal path; and
      a second coupling unit configured to:
         receive the overall quadrature receive signal along the third signal path and the overall in-phase receive signal along the fourth signal path, and
         generate an overall receive signal comprising an Rx output signal and the residual Tx signal at an output thereof.

2. The apparatus of claim 1, wherein the compensation control unit comprises,
   a feedback receiver unit configured to selectively generate a compensation signal based on a measured power of the residual Tx signal or a signal associated therewith; and
   a compensation unit configured to modify the overall in-phase receive signal or the overall quadrature receive signal or both, based on the compensation signal.

3. The apparatus of claim 2, further comprising a third coupling unit coupled to the first output of the second coupling unit configured to receive the overall receive signal and sample the residual Tx signal from the overall receive signal to generate a residual Tx output signal at a first output thereof and convey the overall receive signal to an Rx input port of a transceiver via a second output thereof.

4. The apparatus of claim 3, wherein the feedback receiver unit is configured to:
   receive the residual Tx output signal from the first output of the third coupling unit, and
   generate the compensation signal for compensating the overall in-phase receive signal or the overall quadrature receive signal or both, based on retrieving a value associated with the residual Tx output signal from a memory unit associated therewith.

5. The apparatus of claim 2, wherein the compensation unit comprises an attenuation unit coupled to the third signal path or the fourth signal path, and configured to provide an attenuation to the overall quadrature receive signal or the overall in-phase receive signal respectively, based on the compensation signal.

6. The apparatus of claim 5, wherein the compensation unit further comprises a phase shift unit coupled to the third signal path or the fourth signal path, and configured to provide a phase shift to the overall quadrature receive signal or the overall in-phase receive signal respectively, based on the compensation signal.

7. The apparatus of claim 2, wherein the feedback receiver unit is configured to selectively generate the compensation signal based on a predetermined condition.

8. The apparatus of claim 7, wherein the predetermined condition comprises the measured power of the residual Tx signal or the signal associated therewith exceeding a predetermined threshold.

9. The apparatus of claim 8, wherein the feedback receiver unit is configured to operate in:
   a correction mode when the measured power of the residual Tx signal or the signal associated therewith exceeds a predetermined threshold, wherein the feedback receiver unit is configured to generate the compensation signal; and
   a monitor mode when the measured power of the residual Tx signal or the signal associated therewith falls below the predetermined threshold, wherein the feedback receiver unit is configured to dynamically monitor the power of the residual Tx signal or the signal associated therewith.

10. The apparatus of claim 2, wherein the compensation unit is further configured to modify a first signal comprising the quadrature Rx signal and the in-phase Tx signal in the first signal path or a second signal comprising the in-phase Rx signal and the quadrature Tx signal in the second signal path or both, based on the compensation signal.

11. The apparatus of claim 10, wherein the compensation unit comprises an attenuation unit coupled to the first signal path or the second signal path, and configured to provide an attenuation to the first signal or the second signal respectively, based on the compensation signal.

12. The apparatus of claim 11, wherein the compensation unit comprises a phase shift unit coupled to the first signal path or the second signal path, and configured to provide a phase shift to the first signal or the second signal respectively, based on the compensation signal.

13. An apparatus for interference cancellation in a wireless communication system, comprising:
a cancellation unit configured to:
receive a transmit (Tx) signal from an output port of a power amplifier and a receive (Rx) signal from an antenna, wherein due to a coupling of the Tx signal and the Rx signal within the cancellation unit, the Rx signal contains portions of the Tx signal, and
generate a cancellation of a primary portion of the Tx signal from the Rx signal at an output thereof, leaving a residual portion as a residual Tx signal in the Rx signal, wherein the Rx signal that is output from the cancellation unit is coupled to an Rx input port of a transceiver;
a compensation control unit configured to modify one or more signals within the cancellation unit, based on the residual Tx signal at the output of the cancellation unit, wherein the modification of the one or more signals results in a reduction or an elimination of the residual Tx signal at the output of the cancellation unit; and
a power monitoring unit configured to measure a power of the Tx signal from the output port of the power amplifier and selectively activate the compensation control unit, based on the measured power of the Tx signal.

14. The apparatus of claim 13, wherein the power monitoring system is configured to activate the compensation control unit when the measured power of the Tx signal exceeds a predetermined power.

15. An apparatus for interference cancellation in a wireless communication system, comprising:
a first coupling unit configured to:
receive a transmit (Tx) signal from an output port of a power amplifier and generate an in-phase Tx signal in a first signal path and a quadrature Tx signal in a second signal path; and
receive a receive (Rx) signal from an antenna and generate an in-phase Rx signal in the second signal path and a quadrature Rx signal in the first signal path;
a receive filter unit coupled to the first signal path and the second signal path and configured to:
generate an overall quadrature receive signal comprising the quadrature Rx signal and a residual component of the in-phase Tx signal in a third signal path, and
generate an overall in-phase receive signal comprising the in-phase Rx signal and a residual component of the quadrature Tx signal in a fourth signal path;
a second coupling unit configured to receive the overall quadrature receive signal along the third signal path and the overall in-phase receive signal along the fourth signal path, and generate an overall receive signal comprising a desired Rx signal and a residual Tx signal at an output thereof;
a feedback receiver unit configured to selectively generate a compensation signal based on a measured power of the residual Tx signal or a signal associated therewith; and
a compensation unit configured to modify the overall in-phase receive signal or the overall quadrature receive signal or both, based on the compensation signal.

16. The apparatus of claim 15, wherein the first coupling unit comprises a quadrature hybrid coupler configured to:
receive the transmit (Tx) signal from the output port of the power amplifier at a first input and generate the in-phase Tx signal at a first output thereof and the quadrature Tx signal at a second output thereof; and
receive the receive (Rx) signal from the antenna at a second input and generate the in-phase Rx signal at the second output thereof and the quadrature Rx signal at the first output thereof.

17. The apparatus of claim 15, wherein the receive filter unit comprises:
a first receive filter unit coupled to the first signal path configured to filter out the in-phase Tx signal in the first signal path and generate the overall quadrature receive signal at an output thereof, and
a second receive filter unit coupled to the second signal path configured to filter out the quadrature Tx signal in the second signal path and generate the overall in-phase receive signal at an output thereof.

18. The apparatus of claim 17, wherein the first receive filter unit and the second receive filter unit are tunable.

19. The apparatus of claim 15, wherein the second coupling unit comprises a quadrature hybrid coupler configured to:
receive the overall quadrature receive signal along the third signal path at a first input thereof and receive the overall in-phase receive signal along the fourth signal path at a second input thereof, and
generate the overall receive signal comprising the desired Rx signal and the residual Tx signal at a first output thereof, wherein the desired Rx signal comprises a combination of the in-phase Rx signal and the quadrature Rx signal.

20. The apparatus of claim 15, further comprising a third coupling unit comprising a directional coupler coupled to the first output of the second coupling unit, and configured to receive the overall receive signal and sample the residual Tx signal from the overall receive signal to generate a residual Tx output signal at a first output thereof and convey the overall receive signal to an Rx input port of a transceiver via a second output thereof.

21. The apparatus of claim 15, wherein the compensation unit is further configured to modify a first signal comprising the quadrature Rx signal and the in-phase Tx signal in the first signal path or a second signal comprising the in-phase Rx signal and the quadrature Tx signal in the second signal path or both, based on the compensation signal.

22. A method for interference cancellation in a wireless communication system, comprising:
receiving a transmit (Tx) signal and a receive (Rx) signal at a first coupling unit and generating a first signal comprising a quadrature Rx signal and an in-phase Tx signal in a first signal path and a second signal comprising an in-phase Rx signal and a quadrature Tx signal in a second signal path;
filtering the first signal and the second signal at a receive filter unit to generate an overall quadrature receive signal comprising the quadrature Rx signal and a residual component of the in-phase Tx signal in a third signal path, and an overall in-phase receive signal comprising the in-phase Rx signal and a residual component of the quadrature Tx signal in a fourth signal path respectively;
receiving the overall quadrature receive signal along the third signal path and the overall in-phase receive signal along the fourth signal path at a second coupling unit, and generating an overall receive signal comprising a desired Rx signal and a residual Tx signal;

selectively generating a compensation signal for compensating the overall quadrature signal along the third signal path or the overall in-phase signal along the fourth signal path or both at a feedback receiver unit, based on the residual Tx signal or a signal associated therewith; and modifying the overall quadrature signal along the third signal path or the overall in-phase signal along the fourth signal path or both, based on the compensation signal at a compensation unit for reducing or eliminating the residual Tx signal in the overall receive signal.

23. The method of claim 22, wherein the compensation signal is further configured to compensate the first signal along the first signal path or the second signal along the second signal path or both.

24. The method of claim 22, further comprising sampling the residual Tx signal in the overall receive signal at a third coupling unit to generate a residual Tx output signal and feeding the residual Tx output signal to the feedback receiver unit, prior to generating the compensation signal.

* * * * *